(12) United States Patent
Le Royer et al.

(10) Patent No.: US 7,732,282 B2
(45) Date of Patent: Jun. 8, 2010

(54) TRANSISTOR OF THE I-MOS TYPE COMPRISING TWO INDEPENDENT GATES AND METHOD OF USING SUCH A TRANSISTOR

(75) Inventors: Cyrille Le Royer, Grenoble (FR); Olivier Faynot, Seyssinet Pariset (FR); Laurent Clavelier, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 238 days.

(21) Appl. No.: 12/085,866

(22) PCT Filed: Dec. 1, 2006

(86) PCT No.: PCT/FR2006/002628

§ 371 (c)(1),
(2), (4) Date: May 30, 2008

(87) PCT Pub. No.: WO2007/065985

PCT Pub. Date: Jun. 14, 2007

(65) Prior Publication Data

US 2009/0096028 A1 Apr. 16, 2009

(30) Foreign Application Priority Data

Dec. 6, 2005 (FR) .................. 05 12358

(51) Int. Cl.
*H01L 21/00* (2006.01)

(52) U.S. Cl. ............ 438/268; 438/286; 438/305; 438/586; 438/595; 257/E21.417; 257/E21.435; 257/E27.132; 257/E27.133; 257/E29.151; 257/E29.152; 257/E29.255; 257/E29.256; 257/E29.257

(58) Field of Classification Search ......... 438/268–305, 438/586–599; 257/E21.417, 435, E27.132, 257/133, E29.151, 152, 255–257
See application file for complete search history.

(56) References Cited

U.S. PATENT DOCUMENTS

| 5,550,397 | A | * | 8/1996 | Lifshitz et al. | ............ 257/412 |
| 5,616,944 | A | | 4/1997 | Mizutani et al. | |
| 5,861,645 | A | * | 1/1999 | Kudo et al. | ............ 257/291 |
| 6,661,036 | B1 | | 12/2003 | Sittig et al. | |
| 7,087,981 | B2 | * | 8/2006 | Kapels et al. | ............ 257/610 |

(Continued)

FOREIGN PATENT DOCUMENTS

WO  WO 04/001801 A2  12/2003

OTHER PUBLICATIONS

Gopalakrishnan et al., "Impact Ionization MOS (I-MOS)—Part II: Experimental Results," *IEEE Transactions on Electron Devices*, vol. 52, No. 1, Jan. 2005, pp. 77-84.

(Continued)

*Primary Examiner*—Michael S Lebentritt
(74) *Attorney, Agent, or Firm*—Oliff & Berridge, PLC

(57) ABSTRACT

The transistor comprises a source and a drain separated by a lightly doped intermediate zone. The intermediate zone forms first and second junctions respectively with the source and with the drain. The transistor comprises a first gate to generate an electric field in the intermediate zone, on the same side as the first junction, and a second gate to generate an electric field in the intermediate zone, on the same side as the second junction.

7 Claims, 2 Drawing Sheets

U.S. PATENT DOCUMENTS

| | | | |
|---|---|---|---|
| 7,638,370 B2 * | 12/2009 | Gossner et al. | 438/135 |
| 2003/0173611 A1 * | 9/2003 | Bertz et al. | 257/302 |
| 2006/0220086 A1 * | 10/2006 | Charbuillet et al. | 257/296 |
| 2008/0200001 A1 * | 8/2008 | Clavelier et al. | 438/305 |
| 2009/0072279 A1 * | 3/2009 | Moselund et al. | 257/288 |
| 2009/0283824 A1 * | 11/2009 | Knight et al. | 257/335 |

OTHER PUBLICATIONS

Choi et al., "80nm Self-Aligned Complementary I-MOS Using Double Sidewall Spacer and Elevated Drain Structure and Its Applicability to Amplifiers with High Linearity," *International Electron Devices Meeting*, Dec. 13-15, 2004, pp. 203-206.

* cited by examiner

US 7,732,282 B2

TRANSISTOR OF THE I-MOS TYPE COMPRISING TWO INDEPENDENT GATES AND METHOD OF USING SUCH A TRANSISTOR

BACKGROUND OF THE INVENTION

The invention relates to an I-MOS-type transistor comprising a source formed by a first zone doped by a first type of doping, a drain formed by a second zone doped by a second type of doping, and a lightly doped intermediate zone arranged between the source and drain, the intermediate zone forming first and second junctions respectively with the source and drain, the transistor comprising a first gate to generate an electric field in the intermediate zone, on the same side as the first junction.

STATE OF THE ART

The document WO2004/001801 describes a MOS transistor (metal/oxide/semiconductor) comprising a PIN structure. This PIN structure comprises a semiconducting intermediate zone (I), lightly doped either $n^-$-type or $p^-$-type, arranged between a P-doped zone and an N-doped zone. The intermediate zone I forms a first P-I semiconducting junction with the P-doped zone and a second I-N semiconducting junction with the second zone. An insulated gate enables an electric field to be applied nearer to one of the two junctions than to the other junction. The electric field makes the transistor switch between an OFF state and an ON state. In ON state, avalanche breakdown takes place in the intermediate zone. I. A PIN diode whose avalanche voltage can be controlled by the gate is thereby obtained. Abrupt switching between ON state and OFF state is attained by means of the impact ionization phenomenon. The transistor obtained is also called I-MOS transistor (impact ionization MOSFET).

The current-voltage (I-V) characteristic of an I-MOS transistor presents a very low subthreshold slope value of about 5 to 10 mV per decade.

The document WO2004/001801 proposes applications of the I-MOS transistor, such as for example a memory cell or an inverter having a shorter switching time than CMOS-type devices.

A method for fabrication of I-MOS transistors is described in the article "Impact Ionization MOS (I-MOS)-Part-II: Experimental Results" by K. Gopalakrishnan et al. (IEEE Transactions on Electron Devices, volume 52, p. 77-84, 2005).

In addition, the article "80 nm Self-Aligned Complementary I-MOS Using Double Sidewall Spacer and Elevated Drain Structure and Its Applicability to Amplifiers with High Linearity," by W. Y. Choi et al. (International Electron Devices Meeting, San Francisco, U.S.A., pp. 203-206, Dec. 13-15, 2004) proposes a method for fabricating I-MOS devices using spacers to control the dimensions of the gate and of the intermediate zone.

OBJECT OF THE INVENTION

The object of the invention is to improve I-MOS-type transistors, more particularly to enable additional electronic and logic functions to be realized.

This object is attained by a transistor according to the appended claims and more particularly by the fact that the transistor comprises a second gate to generate an electric field in the intermediate zone on the second junction side.

It is a further object of the invention to provide a method for using a transistor according to the invention, comprising:
   application of a source-drain voltage between the source and drain so that a corresponding electric field, generated in the intermediate zone, is weaker than the critical impact ionization field of the semiconducting material used,
   application of a gate voltage to one of the first and second gates creating a conducting inversion channel near the corresponding gate so that the source-drain voltage drops over a shorter distance than an initial length of the intermediate zone, the corresponding electric field being stronger than the critical field.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
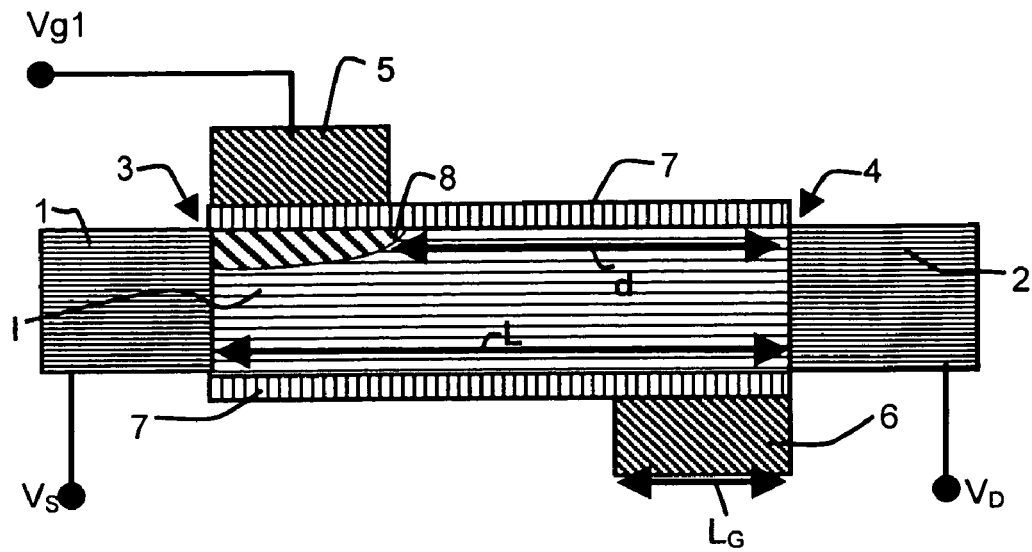
FIGS. 1 to 4 represents cross-sectional views of four particular embodiments of a transistor according to the invention.

In FIG. 1, an I-MOS (impact ionization MOSFET) transistor comprises a semiconducting first zone 1 doped by a first type of doping, for example P+, and a semiconducting second zone 2 doped by a second type of doping, for example N+. The first and second types of doping are opposite. The first zone 1 and second zone 2 thus respectively form source (1) and drain (2) electrodes of the transistor. A lightly doped intermediate zone I (also called intrinsic zone), for example n-doped or p-doped, is arranged between the first and second zones. Intermediate zone I forms first (3) and second (4) junctions respectively with first zone 1 and second zone 2, thereby constituting a PIN diode.

A first gate 5 enables an electric field to be generated in intermediate zone I, on the same side as first junction 3. A second gate 6 enables an electric field to be generated in intermediate zone I, on the same side as second junction 4. Gates 5 and 6 are separated from intermediate zone I by respective insulating layers 7. The lengths $L_G$ of the two gates are preferably of the same order of magnitude.

In FIG. 1, first gate 5 is arranged on a front face of intermediate zone I and second gate 6 is arranged on a rear face of intermediate zone I.

Figure 2:
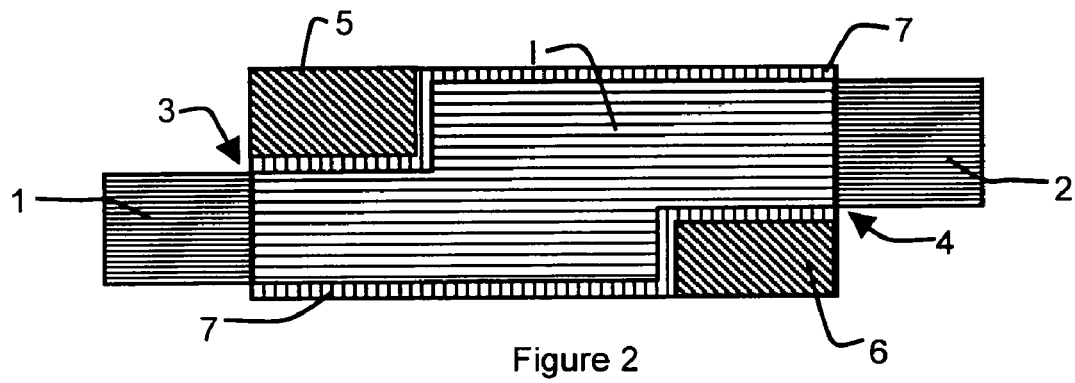

In FIG. 2, gates 5 and 6 are integrated in intermediate zone I in such a way that each gate 5 and 6 forms a common flat face with intermediate zone I. This presents the advantage of achieving the impact ionization effect not only on the surface but also in the volume of intermediate zone I.

Figure 3:
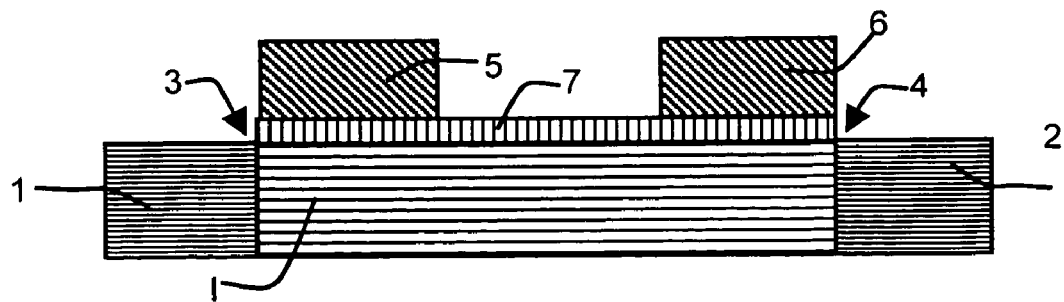

In FIG. 3, first gate 5 and second gate 6 are arranged on the same face of intermediate zone I.

Figure 4:
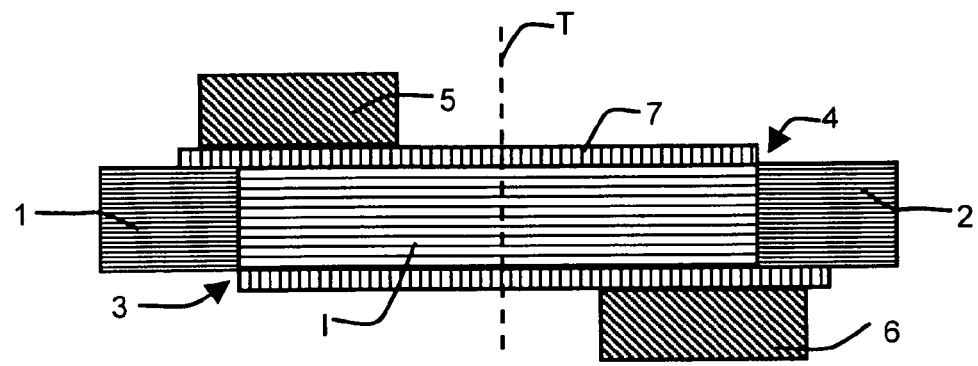

As represented in FIG. 4, gates 5 and 6 can partially overlap the associated doped zones 1 and 2.

All the examples of embodiment have in common the fact that each gate generates an electric field in intermediate zone I on the same side as the corresponding junction. The gates are in fact offset with respect to a transverse mid-line T (FIG. 4)

of the transistor. First gate 5 is thus offset in the direction of first junction 3 and second gate 6 is offset in the direction of second junction 4. The electric field of each gate is therefore essentially located in a region of the intermediate zone I nearer the corresponding junction than the opposite junction.

By applying a voltage to the gate (5 or 6), a charge carrier current is caused. Most of these charge carriers have a charge corresponding to the type of doping of the doped zone nearer the gate (5 or 6). Thus, when first zone 1 is P-doped, first gate 5, arranged near first zone 1 and negative-polarized, generates a positive charge carrier current in a region of intermediate zone I where the gate field effect is sufficient. P-type I-MOS mode operation is then obtained. In the same way, N-type I-MOS mode operation is obtained for an N-doped zone and a positive-polarized gate (5 or 6). In both cases, the PIN diode is controlled by one of the gates, which partially covers the intermediate zone between the source (P-doped zone) and drain (N-doped zone) and which is near source (P-type I-MOS) or drain (N-type I-MOS). Like a MOSFET-type transistor, an I-MOS-type transistor operates as a switch. Depending on the polarization of the gate, the transistor is in fact either ON (strong current between drain and source) or OFF (very weak current between drain and source).

The transistor obtained can also be considered as a transistor with two independent gates having different effects. In particular, the conduction channels generated by the gates are independent. The transistor therefore comprises four independent electrodes: source 1, drain 2, first gate 5 and second gate 6.

When the gate voltage Vg1 of first gate 5 and the gate voltage Vg2 of second gate 6 have not exceeded the respective threshold voltages Vt1 and Vt2, the total current is therefore substantially zero. When only one of the gate voltages is modulated, the gate voltage of the other gate being kept at 0V, the transistor behaves as a conventional I-MOS transistor corresponding to the modulated gate. Use of both gates does however enable superposition of two I-MOS transistors of opposite polarizations to be obtained, i.e. of an N-I-MOS transistor and a P-I-MOS transistor. It is noteworthy that the P-I-MOS transistor has a negative threshold voltage and is turned off for gate voltages greater than its threshold voltage, whereas the N-I-MOS transistor has a positive threshold voltage and is turned off for gate voltages lower than its threshold voltage. In this way, when the absolute values of the two gate voltages Vg1 and Vg2 exceed the absolute values of the respective threshold voltages Vt1 and Vt2 (with Vt1 and Vg1 negative, and with Vt2 and Vg2 positive), the total current It is the sum of the individual currents I1 and I2 respectively corresponding to first junction 3 and to second junction 4, I1 and I2 being positive.

For a P-doped first zone 1 and an N-doped second zone 2, the truth table of such a transistor presents four conduction states:

|  | $|Vg1| > |Vt1|$ | $|Vg1| < |Vt1|$ |
| --- | --- | --- |
| $|Vg2| < |Vt2|$ | I1 | 0 |
| $|Vg2| > |Vt2|$ | I1 + I2 | I2 |

Three current levels or states are thereby obtained, depending on the gate voltages applied to the two gates. The impact ionization phenomenon occurs when the electric field in the intermediate zone I is greater than the critical field Ec. In practice, for given dimensions of the transistor, the supply voltages are fixed and this imposes a maximum value which the critical field Ec must not exceed. The semiconducting material used for intermediate zone I can then be chosen in particular according to the critical field Ec.

A source-drain voltage $V_{D-S}$ is thus applied between doped first (1) and second (2) zones, so that a corresponding electric field generated in intermediate zone I is weaker than critical impact ionization field Ec of the semiconducting material used. A positive source-drain voltage $V_{D-S}$ is applied between drain (2) and source (1).

A gate voltage is then applied to one of the gates, for example a first gate voltage Vg1 to first gate 5, as illustrated in FIG. 1. The gate voltage Vg1 creates a conducting inversion channel 8 near first gate 5 so that source-drain $V_{D-S}$ voltage drops over a shorter distance d than an initial length L of intermediate zone I. The corresponding electric field is thus greater than the critical field Ec. The voltage $V_{D-S}$ is in fact constant and, in accordance with the relation E=U/d, the electric field E within the intermediate zone I increases. When the electric field due to the voltage $V_{D-S}$ is greater than the critical field Ec, impact ionization occurs and avalanche triggering makes the transistor switch from OFF state to ON state. The second gate 6 operates in analogous manner. The current I1 or current I2 mentioned in the truth table above can thereby be established.

Figure 7:
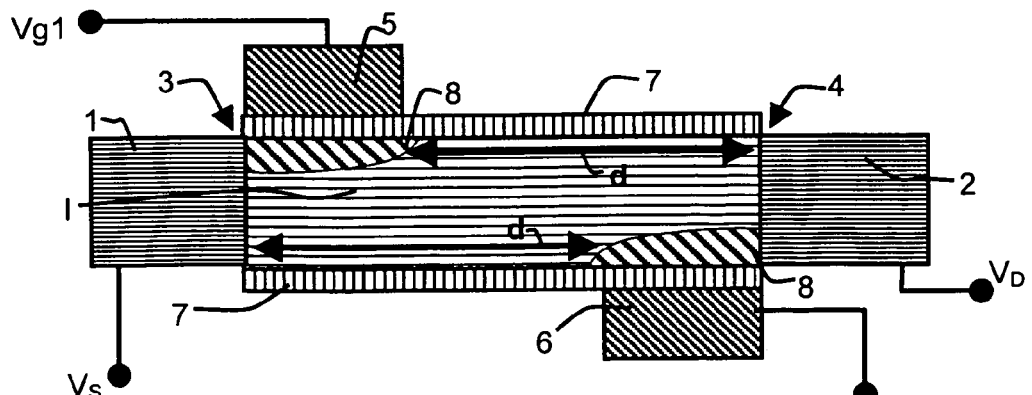
FIG. 7 illustrates a particular embodiment of the transistor according to the invention and of its operation.

To obtain a total current It corresponding to the sum of the individual currents I1 and I2, a first gate voltage Vg1 higher in absolute value than the first threshold voltage Vt1 is applied to first gate 5. Simultaneously (FIG. 7), a second gate voltage Vg2 higher in absolute value than the second threshold voltage Vt2 is applied to second gate 6. Two conducting inversion channels 8 are thus created, respectively near the first and second gates (5, 6), so that the source-drain voltage $V_{D-S}$ drops for each gate over shorter distance d than an initial length L of the intermediate zone I (FIG. 1), the corresponding electric field being greater than the critical field Ec.

As far as dimensioning of the gates is concerned, the gate lengths LG (represented for second gate 6 of FIG. 1), the initial length L of the intermediate zone I, and the distance $d = L - L_G$ over which the source-drain voltage $V_{D-S}$ drops when the transistor is operating, are advantageously determined such as to fulfil the following conditions:

$$\frac{V_{D-S}}{L} < Ec \qquad \text{(equation 1)}$$

$$Ec < \frac{V_{D-S}}{L - L_G}, \qquad \text{(equation 2)}$$

where Ec is the critical field.

The voltage on the gate must create an inversion channel of the same type as the corresponding doped zone, i.e. the nearest source or drain zone. For example, for a gate near an N-type drain (N-I-MOS), a positive voltage is applied. For a gate near a P-type source (P-I-MOS), a negative voltage is applied.

Figure 5:
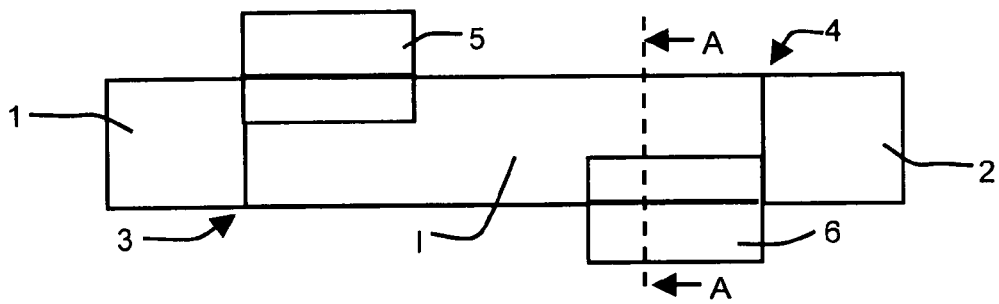
FIGS. 5 and 6 represent a fifth particular embodiment of the transistor according to the invention, respectively in top view and in cross-section along the line A-A.
Figure 6:
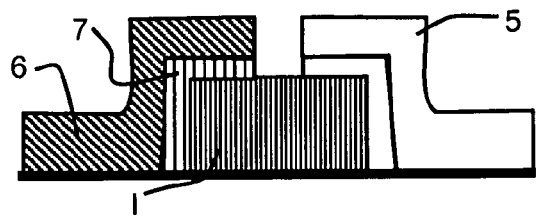

In the particular example of embodiment represented in FIGS. 5 and 6, gates 5 and 6 partially overlap on intermediate zone I. The gates are arranged on a front face of intermediate zone I and on the sidewalls of intermediate zone I, while being insulated from the intermediate zone by respective insulating layers 7. In FIGS. 3, 5 and 6, first gate 5 and second gate 6 are arranged on one and the same face of the transistor, advantageously on the front face, which makes them easier to realize compared with other embodiment examples.

The different embodiments can be combined and in particular gates 5 and 6 can partially overlap the associated doped zones 1 and 2 in the examples of embodiments corresponding to FIGS. 2, 3, 5 and 6.

For non-restrictive example purposes, the respective values of gate length $L_G$, of distance L between source and drain and of thickness e of semiconductor film, preferably made from Si, Ge or SiGe, in which the source, drain and intermediate zone of the transistor are formed, can be as follows:

$L_G \approx 10$ nm, $L \approx 30$ nm and $e \approx 5$ nm for a small transistor, $L_G \approx 250$ nm, $L \approx 750$ nm and $e \approx 50$ nm for a medium-sized transistor, $L_G \approx 2$ µm, $L \approx 6$ µm and $e \approx 0.3$ µm for a large transistor.

The invention claimed is:

1. An I-MOS-type transistor comprising a source formed by a first zone doped by a first type of doping, a drain formed by a second zone doped by a second type of doping, and a lightly doped intermediate zone arranged between the source and drain, the intermediate zone forming first and second junctions respectively with the source and drain, the transistor comprising a first gate to generate an electric field in the intermediate zone, on the same side as the first junction and a second gate to generate an electric field in the intermediate zone on the same side as the second junction.

2. The transistor according to claim 1, wherein the first gate is arranged on a front face of the intermediate zone and the second gate is arranged on a rear face of the intermediate zone.

3. The transistor according to claim 1, wherein the first gate and second gate are arranged on the same face of the intermediate zone.

4. The transistor according to claim 1, wherein the gates partially overlap the associated doped zone.

5. The transistor according to claim 1, wherein the gates partially overlap the intermediate zone.

6. A method for using a transistor according to claim 1, comprising:

application of a source-drain voltage between the source and drain so that a corresponding electric field, generated in the intermediate zone, is weaker than the critical impact ionization field of the semiconducting material used, application of a gate voltage to one of the first and second gates creating a conducting inversion channel near the corresponding gate so that the source-drain voltage drops over a shorter distance than an initial length of the intermediate zone, the corresponding electric field being stronger than the critical field.

7. The method according to claim 6, comprising:

application, to the first gate, of a first gate voltage higher in absolute value than a first threshold voltage, and application, to the second gate, of a second gate voltage higher in absolute value than a second threshold voltage, creating two conducting inversion channels respectively near first and second gates so that the source-drain voltage drops over a shorter distance than the initial length of the intermediate zone, the corresponding electric field being greater than the critical field.

* * * * *